United States Patent
Viswanadam et al.

(10) Patent No.: US 6,759,319 B2
(45) Date of Patent: Jul. 6, 2004

(54) RESIDUE-FREE SOLDER BUMPING PROCESS

(75) Inventors: Gautham Viswanadam, Singapore (SG); Chee Chong Wong, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/858,526

(22) Filed: May 17, 2001

(65) Prior Publication Data

US 2002/0173134 A1 Nov. 21, 2002

(51) Int. Cl.[7] .............................................. H01L 21/44
(52) U.S. Cl. .................................... 438/613; 438/699
(58) Field of Search ................. 148/DIG. 51, DIG. 81, 148/DIG. 131; 257/40, 737, 751, 752, 754, 758–760, 761, 764, 765, 768, 773, 774, 776; 438/613, 614, 622, 623, 624, 626, 629, 631, 634, 699, 763, 787, 970

(56) References Cited

U.S. PATENT DOCUMENTS

| | | | |
|---|---|---|---|
| 4,273,859 A | 6/1981 | Mones et al. ................ 430/315 |
| 5,024,372 A | 6/1991 | Altman et al. ............... 228/248 |
| 5,194,137 A | 3/1993 | Moore et al. ................ 205/125 |
| 5,400,950 A | 3/1995 | Myers et al. ........... 228/180.22 |
| 5,672,542 A | 9/1997 | Schwiebert et al. ......... 437/183 |
| 5,767,010 A | 6/1998 | Mis et al. .................... 438/614 |
| 5,892,179 A | 4/1999 | Rinne et al. ................. 174/261 |
| 6,222,279 B1 * | 4/2001 | Mis et al. .................... 257/779 |
| 6,232,212 B1 * | 5/2001 | Degani et al. ............... 438/612 |
| 6,281,106 B1 * | 8/2001 | Higdon et al. .............. 438/613 |
| 6,310,403 B1 * | 10/2001 | Zhang et al. ................ 257/786 |
| 6,338,985 B1 * | 1/2002 | Greenwood ................. 438/126 |
| 6,340,608 B1 * | 1/2002 | Chooi et al. ................ 438/108 |

* cited by examiner

Primary Examiner—Kamand Cuneo
Assistant Examiner—Asok Kumar Sarkar
(74) Attorney, Agent, or Firm—George O. Saile; Stephen B. Ackerman; Douglas R. Schnabel

(57) ABSTRACT

A new method of fabricating solder bumps in the manufacture of an integrated circuit device has been achieved. Contact pads are provided overlying a semiconductor substrate. A passivation layer is provided overlying the contact pads. The passivation layer has openings that expose a top surface of the contact pads. A sacrificial layer is deposited overlying the passivation layer and the exposed top surface of the contact pads. The sacrificial layer is not wettable to solder. Under bump metallurgy (UBM) caps may be formed either by deposition and patterning of a UBM layer stack or by selective electroless deposition of a material such as nickel and gold. An aperture mask is formed overlying the sacrificial layer. The aperture mask has openings that expose a part of the sacrificial layer overlying the contact pads. A solder layer is printed into the openings in the aperture mask. The solder layer is reflowed to form solder bumps overlying the contact pads. The aperture mask is stripped away. The sacrificial layer is etched away to complete the formation of the solder bumps in the manufacture of the integrated circuit device. The etching away of the sacrificial layer insures the complete removal of all of the residue of the aperture mask.

17 Claims, 9 Drawing Sheets

RESIDUE-FREE SOLDER BUMPING PROCESS

BACKGROUND OF THE INVENTION

1. Field of the Invention

The invention relates to a method of fabricating semiconductor devices, and more particularly, to the fabrication of solder bumps in the manufacture of an integrated circuit device.

2. Description of the Prior Art

Solder paste bumping is emerging as a strong candidate for a low-capital, low-cost method for producing bumped wafers. In a solder paste bumping process, a solder paste is printed onto the integrated circuit through a stencil. Metal stencils or, in the case of fine geometry, lithographically defined polymeric aperture stencils are used. The printed solder paste is then heated, or reflowed, to cause the solder to form a solder ball. This solder ball, or solder bump, then provides a solderable contact point for directly connecting the integrated circuit to a circuit board.

The cleanliness of the final wafer surface produced using a solder paste print method is an important characteristic. This cleanliness depends on flux chemistry, wafer surface conditions, reflow operations, cleaning methods, and cleaning chemistry. Special cleaning problems arise in the case of polymeric aperture stencils. During high temperature exposure, such as during reflow, excessive cross-linking can occur in the polymeric material. This cross-linking phenomenon makes it difficult to remove all of the polymeric material following the formation of the solder bumps.

Several prior art approaches disclose methods to form solder bumps on an integrated circuit device. U.S. Pat. No. 5,767,010 to Mis et al discloses a method to form solder bumps. A titanium barrier layer is formed on the substrate prior to deposition of the underbump metallurgy (UBM) layer. Neither the UBM nor the titanium barrier layer is patterned until after the solder bumps are deposited and reflowed. U.S. Pat. No. 5,892,179 to Rinne et al teaches a method to form a solder bump with an elongated UBM structure that allows an offset between the solder bump and the contact pad. A titanium barrier layer is disclosed in a co-assigned patent application referenced therein. U.S. Pat. No. 4,273,859 to Mones et al discloses a method to form solder bump pads wherein a barrier layer is deposited between the contact pads and the solder bumps. U.S. Pat. No. 5,672,542 to Schwiebert et al teaches a method to form solder bumps. Solder is applied through a stencil that remains in place during reflow. U.S. Pat. No. 5,024,372 to Altman et al discloses a method to form solder bumps wherein a solder resist is applied and patterned to create wells. Solder paste is then applied and reflowed to form bumps. U.S. Pat. No. 5,194,137 to Moore et al teaches a solder bump method. A terminal pad with a connected linear runner is formed on the substrate. A solder alloy is applied. During reflow, solder is drawn from the runner to the terminal pad to form a raised bump. U.S. Pat. No. 5,400,950 to Myers et al discloses a method to form solder bumps wherein the bump height is carefully controlled while improved thermal cycle and mechanical capability is achieved. Non-input/output, or dummy, bumps are used.

SUMMARY OF THE INVENTION

A principal object of the present invention is to provide an effective and very manufacturable method of fabricating solder bumps in the manufacture of integrated circuit devices.

A further object of the present invention is to provide a method to fabricate solder bumps that produces wafers free from flux, polymeric residue, and contamination.

A yet further object of the present invention is to prevent contamination through the use of a sacrificial layer underlying the aperture mask.

Another yet further object of the present invention is to provide a solder bumping method that is free of residues and is compatible with electroless plated UBM.

Another yet further object of the present invention is to provide a solder bumping method suitable for any type of polymeric stencil.

Another yet further object of the present invention is to provide a solder bumping method suitable for either lead-base and lead-free solder pastes.

In accordance with the objects of this invention, a new method of fabricating solder bumps in the manufacture of an integrated circuit device has been achieved. Contact pads are provided overlying a semiconductor substrate. A passivation layer is provided overlying the contact pads. The passivation layer has openings that expose a top surface of the contact pads. A sacrificial layer is deposited overlying the passivation layer and the exposed top surface of the contact pads. The sacrificial layer is not wettable to solder. Under bump metallurgy (UBM) caps may be formed either by deposition and patterning of a UBM layer stack or by selective electroless deposition of a material such as nickel. An aperture mask is formed overlying the sacrificial layer. The aperture mask has openings that expose a part of the sacrificial layer overlying the contact pads. A solder layer is deposited into the openings in the aperture mask. The solder layer is reflowed to form solder bumps overlying the contact pads. The aperture mask is stripped away. The sacrificial layer is etched away to complete the formation of the solder bumps in the manufacture of the integrated circuit device. The etching away of the sacrificial layer insures the complete removal of all of the residue of the aperture mask.

BRIEF DESCRIPTION OF THE DRAWINGS

In the accompanying drawings forming a material part of this description, there is shown.

DESCRIPTION OF THE PREFERRED EMBODIMENTS

The method of the present invention is applied to the formation of solder bumps in the manufacture of an integrated circuit device. Two preferred embodiments of the present invention are disclosed. In the first preferred embodiment, underbump metallurgy (UBM) caps are formed overlying the contact pads 14 through a sputtering process. In the second embodiment, the UBM caps are formed by selective electroless plating of nickel and gold. In each embodiment, a novel sacrificial layer is used to improve aperture mask liftoff after reflow. It should be clear to those experienced in the art-that the present invention can be applied and extended without deviating from the scope of the present invention.

Figure 1:
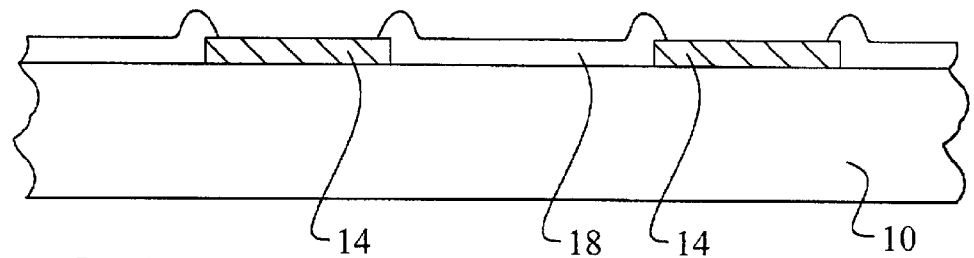
FIGS. 1 through 9 schematically illustrate a first preferred embodiment of the present invention.

Referring now more particularly to FIG. 1, there is illustrated a cross-section of a partially completed integrated circuit device of the first preferred embodiment. A semiconductor substrate 10 is provided. For simplicity of illustration, the semiconductor substrate 10 is shown as a monolithic wafer. In practice, a plurality of active and passive devices, layers, and connective lines will be formed in the semiconductor substrate 10 prior to the formation of the contact pads 14.

The contact pads 14 are formed, preferably by the deposition and patterning of an aluminum layer. The contact pads 14 provide a conductive connection between circuits within the integrated circuit device and external circuits. Very fine bumping pitches of about 50 microns may be used with the method of the present invention. A passivation layer 18 is deposited overlying the contact pads 14 and the semiconductor substrate 10. The passivation layer 18 may comprise any conventional passivation film such as silicon nitride or silicon dioxide. The passivation layer 18 is patterned to form openings that expose the top surface of the contact pads 14.

Figure 2:
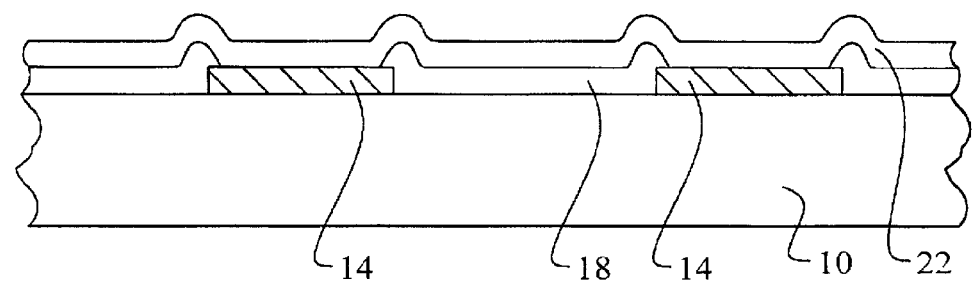

Referring now to FIG. 2, an important feature of the present invention is illustrated. A sacrificial layer 22 is deposited overlying the passivation layer 18 and the exposed surface of the contact pads 14. This sacrificial layer 22 is an important and novel feature of the present invention to insure that all polymer, flux, and other residues are completely removed from the wafer surface following the formation of the solder bumps.

The sacrificial layer 22 must exhibit good adhesion to the passivation layer 18 and to the contact pads 14. The sacrificial layer 22 must be non-wettable to solder. In addition, the sacrificial layer should comprise a material that may be selectively etched against solder. The sacrificial layer 22 preferably comprises titanium, a titanium-tungsten alloy, or chromium. The sacrificial layer may be deposited by, for example, evaporation or sputtering, to a thickness of between about 1,000 Angstroms and 1,500 Angstroms.

Figure 3:
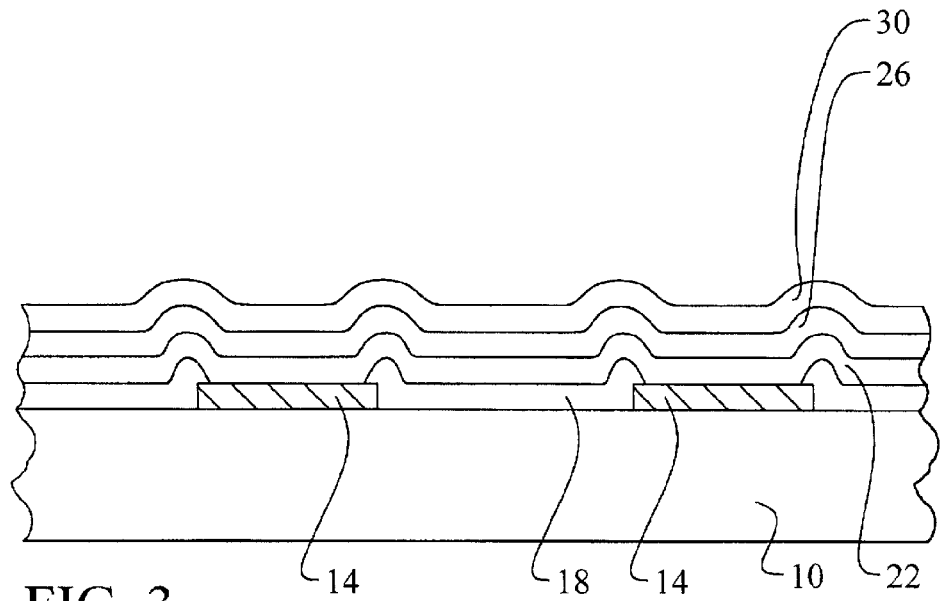

Referring now to FIG. 3, an under bump metallurgy (UBM) layer 26 and 30 may be deposited overlying the sacrificial layer. A UBM layer 26 and 30 is often used to improve the bump-contact performance. The preferred UBM layer 26 and 30 comprises a stack of materials such as nickel/gold, copper/chromium/nickel/gold, copper/nickel/gold, or copper/nickel/copper. The UBM layer 26 and 30 is deposited by, for example, sputtering, to a combined thickness of between about 5,000 Angstroms and 15,000 Angstroms.

Figure 4:
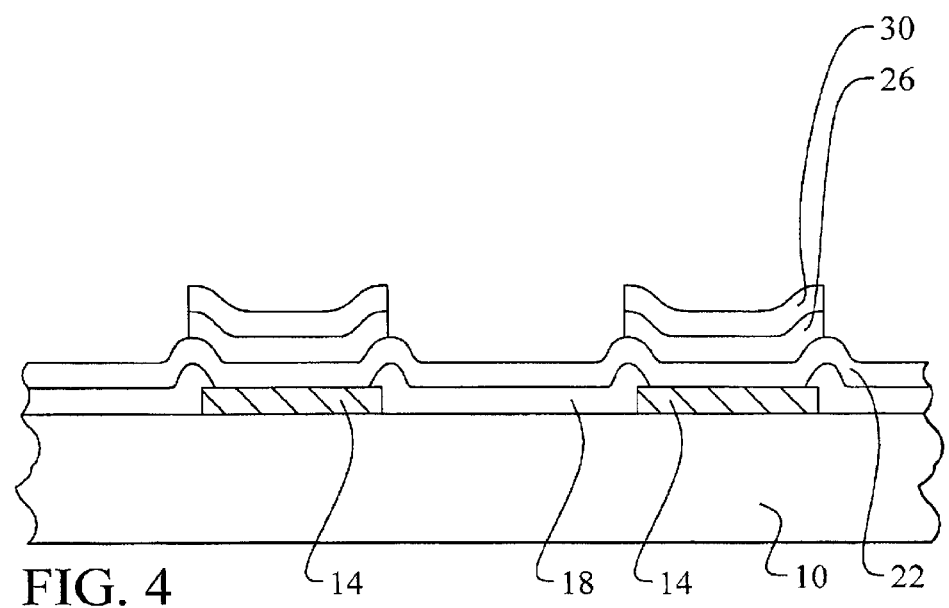

Referring now to FIG. 4, the UBM layer 26 and 30 is patterned to form UBM caps 26 and 30 overlying the contact pads 14. This patterning is accomplished using, for example, a photolithography and etch sequence. A photoresist material, not shown, is first coated onto the wafer and exposed to actinic (UV) light through a mask. The photoresist material is then developed. The UBM layer 26 and 30 is etched through using the photoresist material as a mask. The photoresist material is then removed.

Figure 5:
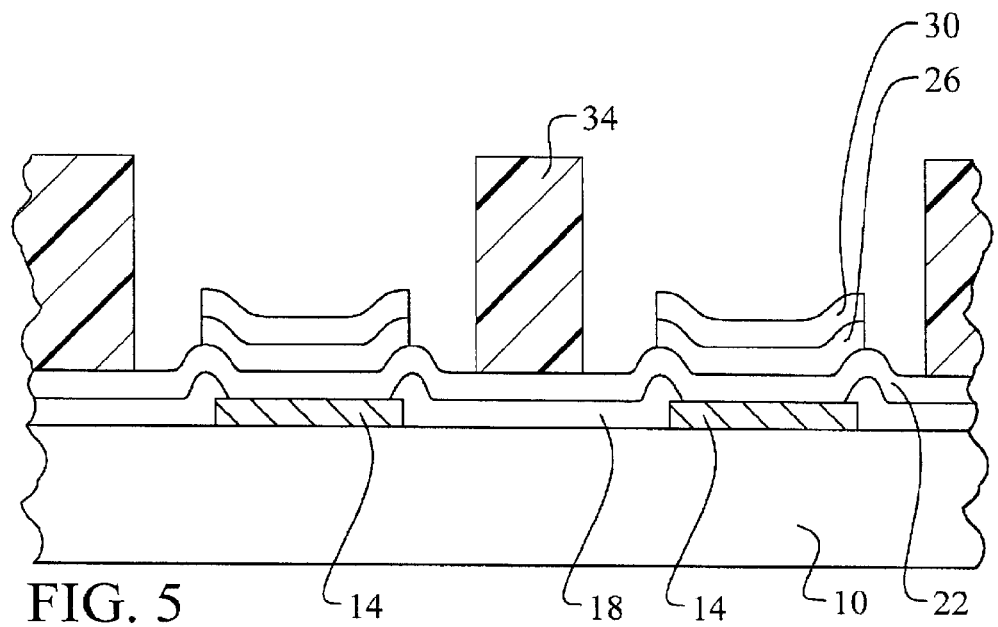

Referring now to FIG. 5, an aperture mask 34 is formed overlying the sacrificial layer 22. The aperture mask 34 has square or circular openings that expose the UBM caps 26 and 30 and that expose a part-of the sacrificial layer 22 overlying the contact pads 14. The purpose of the aperture mask 34 is to define an area for the depositing of solder onto the integrated circuit device. Note that the aperture mask openings are somewhat larger than the UBM caps 26 and 30. This means that excess solder will be present during the reflow operation to insure that the solder ball is sufficiently large.

The aperture mask 34 may be formed in any of several ways. For example, the aperture mask 34 may comprise a metal stencil, a photosensitive resist, a dry film, or a laser drilled polymer. The method of the present invention works well with any of these aperture mask materials.

If the aperture mask 34 comprises a photosensitive resist or dry film material, then this material may be patterned using a photolithography and etch sequence. For example, the aperture mask layer 34 is first coated or laminated onto the wafer and then is exposed to actinic (UV) light through a mask. The aperture mask layer 34 is then developed. The portion of the aperture mask layer 34 that was not exposed is removed using a developer solution. The remaining material forms the aperture mask 34 as shown.

Alternatively, a polymer material could be applied and patterned using a laser drilling device. For example, these polymer materials could be used to form solder masks, as UV adhesive films, or with wafer dicing tape.

The advantage of the present invention is particularly visible for any aperture mask 34 materials that contain polymer materials, such as photosensitive resist, dry film, non-photosensitive resist, or laser drilled polymers. These materials must be used for fine geometry patterns of, for example, 50 microns. As noted previously, polymer materials may exhibit excessive cross-linking during the solder reflow operation. Cross-linking makes the polymers very difficult to completely remove from the wafer surface after reflow is complete. However, the presence of the novel sacrificial layer 22 underlying the aperture mask 34 insures that all of the polymer material is removed when the sacrificial layer 22 is removed.

Figure 6:
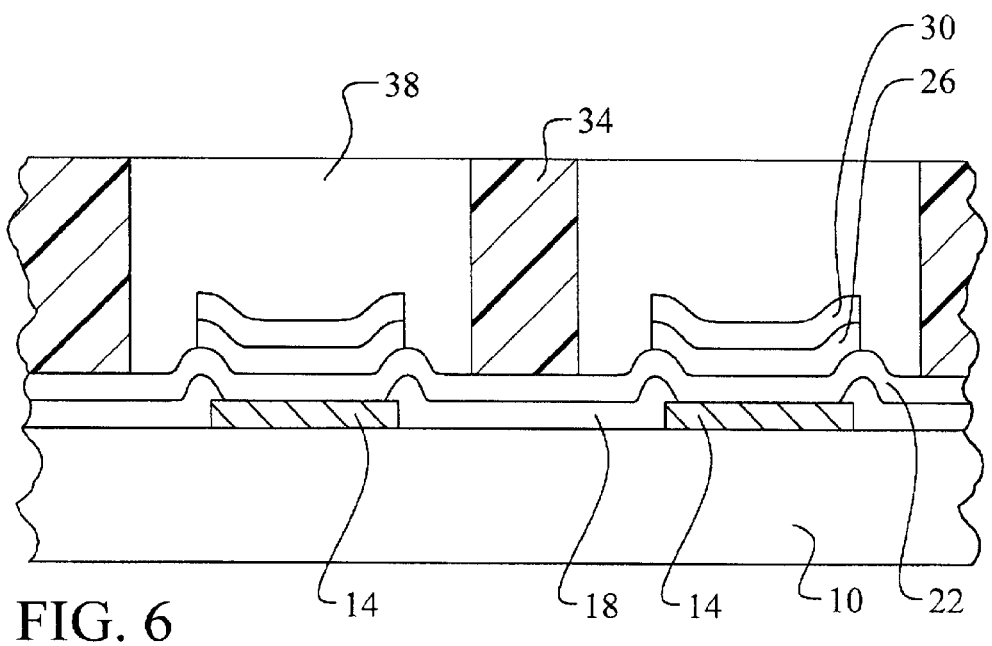

Referring now to FIG. 6, a solder layer 38 is deposited into the openings in the aperture mask 34. The solder layer 38 may comprise lead-based solder or lead-free solder. The solder layer 38 is applied to completely fill the aperture mask 34 openings as shown. The solder layer 38 may be deposited by printing, evaporating, or plating.

Figure 7:
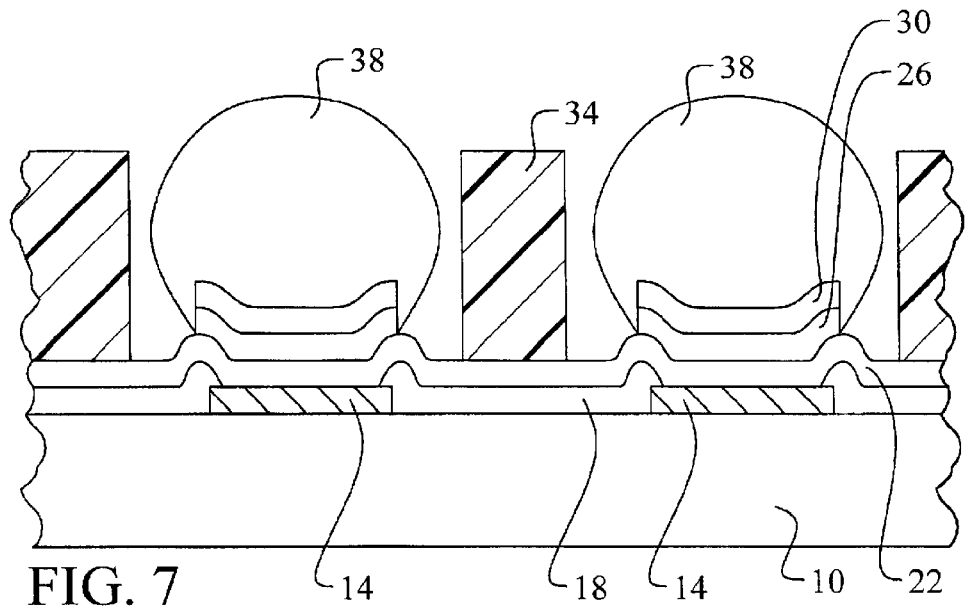

Referring now to FIG. 7, an important step in the method of the present invention is illustrated. The solder layer 38 is reflowed to form solder bumps 38. The reflowing step is performed by heating the wafers in a reflow oven to a temperature of between about 100 degrees C. and 260 degrees C. During the reflow operation, the solder layer 38 melts and wets, or bonds to, the UBM layer stack 26 and 30. Because the sacrificial layer 22 and the aperture mask 34 do not wet with the solder layer 38, the solder pulls away from these materials. The surface tension of the molten solder layer 38 causes it to form a solder ball or bump overlying the UBM layer 26 and 30 and the contact pads 14.

Figure 8:
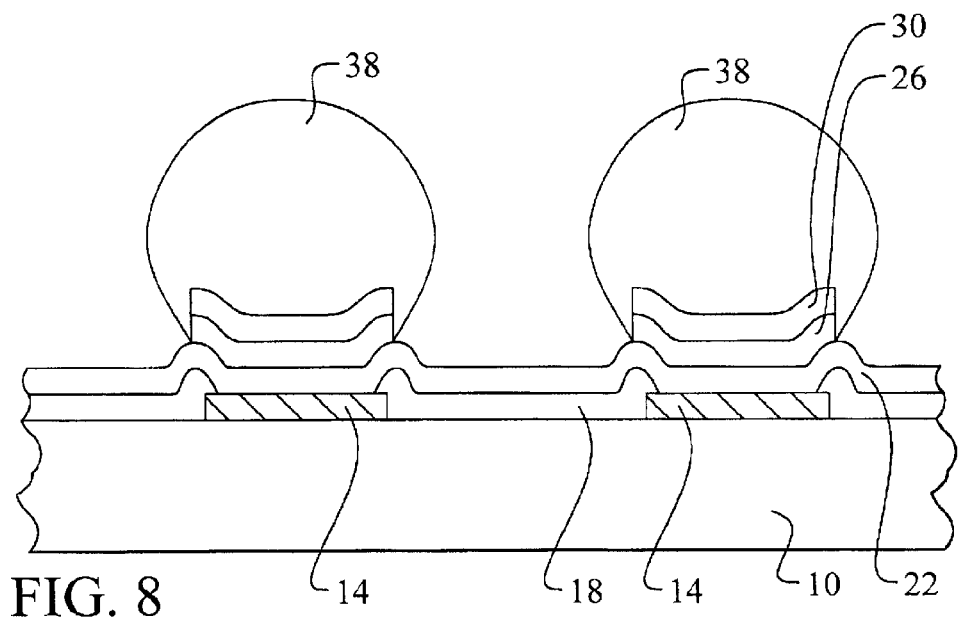
Figure 9:
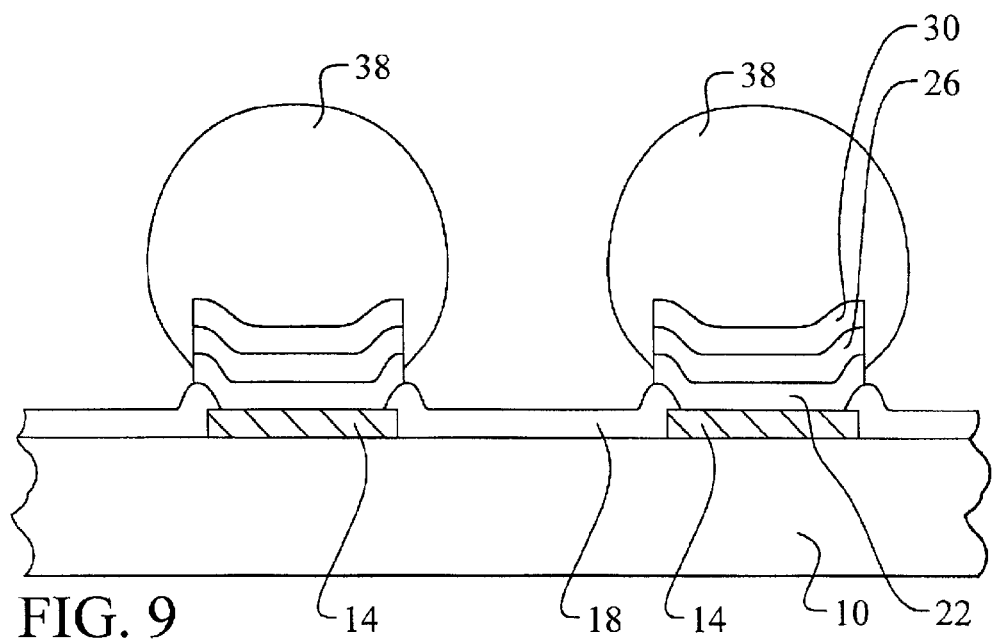

Referring now to FIG. 8, the aperture mask 34 is removed after the reflow operation. The aperture mask 34 is preferably removed using a chemical solvent strip. The strip of the aperture mask 34 reveals the top surface of the sacrificial layer 22.

Referring now to FIG. 8, an important feature of the present invention is illustrated. The exposed sacrificial layer 22 is etched away. The sacrificial layer 22 is etched away using an etching chemistry that selectively etches the sacrificial layer 22 without etching the solder bumps 38. Preferably, an anisotropic etch is used so that the sacrificial layer 22 under the UBM layer 26 and 30 is not undercut. For example, the sacrificial layer 22 may be etched using a wet etch comprising HF, $HNO_3$, and $H_2O$.

The removal of the exposed sacrificial layer 22 insures that all residue of the aperture mask 34 is removed. In addition, any flux residue from the solder paste layer 38 is removed with the sacrificial layer 22. The use of the sacrificial layer 22 thereby eliminates the need for a high-pressure jet deflux station for flux removal. In addition, the underlying passivation layer 18 is protected from scratches or other process contamination. Finally, if a second reflow operation is required, the sacrificial layer 22 may be left on the wafer until after the second reflow is completed.

Figure 10:
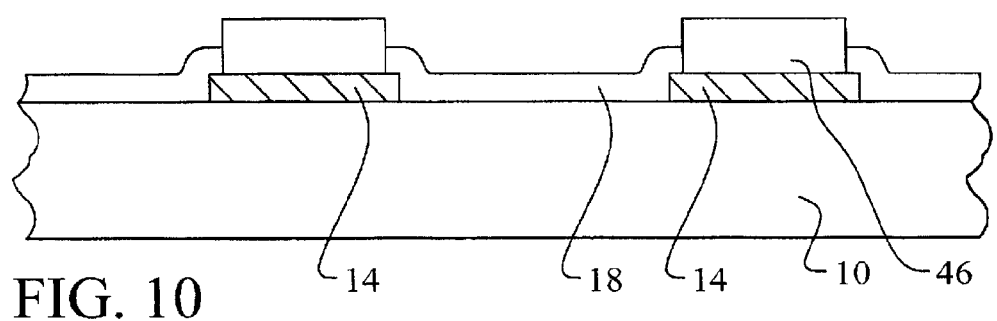
FIGS. 10 through 17 schematically illustrate a second preferred embodiment of the present invention.

Referring now to FIG. 10 a second preferred embodiment of the present invention is illustrated. As in the first embodiment, the contact pads 14 are formed, preferably by the deposition and patterning of an aluminum layer. Very fine bumping pitches of about 50 microns may also be used in this embodiment. A passivation layer 18 is deposited overlying the contact pads 14 and the semiconductor substrate 10. The passivation layer 18 may comprise any conventional passivation film such as silicon nitride or silicon dioxide. The passivation layer 18 is patterned to form openings that expose the top surface of the contact pads 14.

An important feature of this embodiment is the use of electroless-plated nickel (Ni) and gold (Au) for the UBM cap 46. In this process, the wafers are placed in nickel and gold electroless plating solutions, respectively. Because of the presence of the passivation layer 18, the nickel and gold layer 46 is selectively deposited only overlying the exposed contact pads 14. This approach saves a masking and etching sequence by only plating the nickel and gold UBM caps 46 where they are needed. The nickel and gold UBM caps 46 are preferably deposited to a combined thickness of between about 4,300 Angstroms and 6,300 Angstroms. The partial nickel thickness is preferably between about 4,000 Angstroms and 6,000 Angstroms, and the partial gold thickness is preferably about 300 Angstroms.

Figure 11:
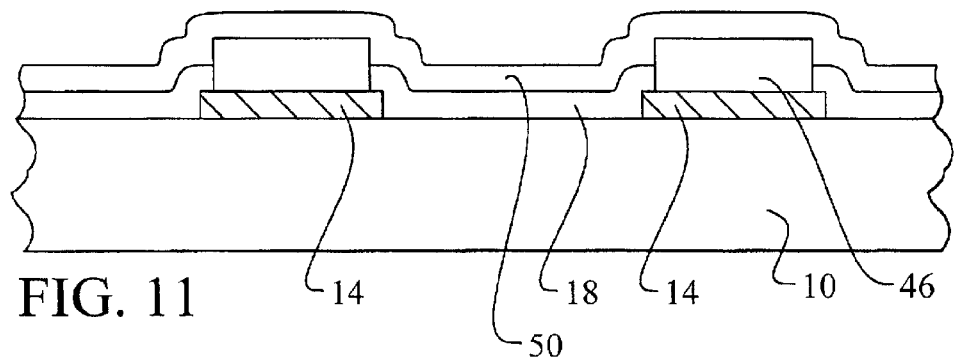

Referring now to FIG. 11, an important feature of the second embodiment of the present invention is illustrated. A sacrificial layer 50 is deposited overlying the passivation layer 18 and the nickel and gold layer 46. This sacrificial layer 50 will again insure that all polymer, flux, and other residues are completely removed from the wafer surface following the formation of the solder bumps.

The sacrificial layer 50 must exhibit good adhesion to the passivation layer 18 and to the nickel and gold layer 46. The sacrificial layer 50 must be non-wettable to solder. In addition, the sacrificial layer 50 should comprise a material that may be selectively etched against solder. The sacrificial layer 50 preferably comprises titanium, a titanium-tungsten alloy, or chromium. The sacrificial layer may be deposited by, for example, evaporation or sputtering, to a thickness of between about 1,000 Angstroms and 1,500 Angstroms.

Figure 12:
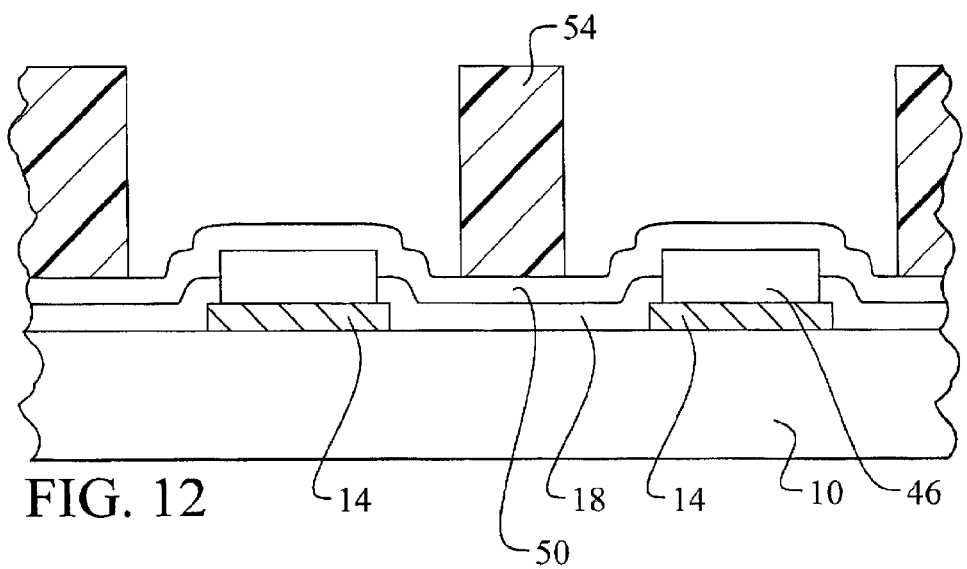

Referring now to FIG. 12, an aperture mask 54 is formed overlying the sacrificial layer 50. The aperture mask 54 has openings that expose a part of the sacrificial layer 50 overlying the contact pads 14. The purpose of the aperture mask 54 is to define an area for the depositing of solder onto the integrated circuit device. Note that the aperture mask openings are somewhat larger than the contact pads 14. This means that excess solder will be present during the reflow operation to insure that the solder ball is sufficiently large.

The aperture mask 54 may again be formed in any of several ways. For example, the aperture mask 54 may comprise a metal stencil, a photosensitive resist, a dry film, or a laser drilled polymer. The method of the present invention works well with any of these aperture mask materials.

If the aperture mask 54 comprises a photosensitive resist material, then this material may be patterned using a photolithography and etch sequence as discussed above in the first embodiment. In addition, a polymer material could be applied and patterned using a laser drilling device.

The advantage of the present invention is again particularly visible for any aperture mask 54 materials that contain polymer materials, such as photosensitive resist, dry film, or laser drilled polymers. These materials must be used for fine geometry patterns of, for example, 50 microns. The presence of the novel sacrificial layer 50 underlying the aperture mask 54 insures that even cross-linked polymer material is removed when the sacrificial layer 50 is removed.

Figure 13:
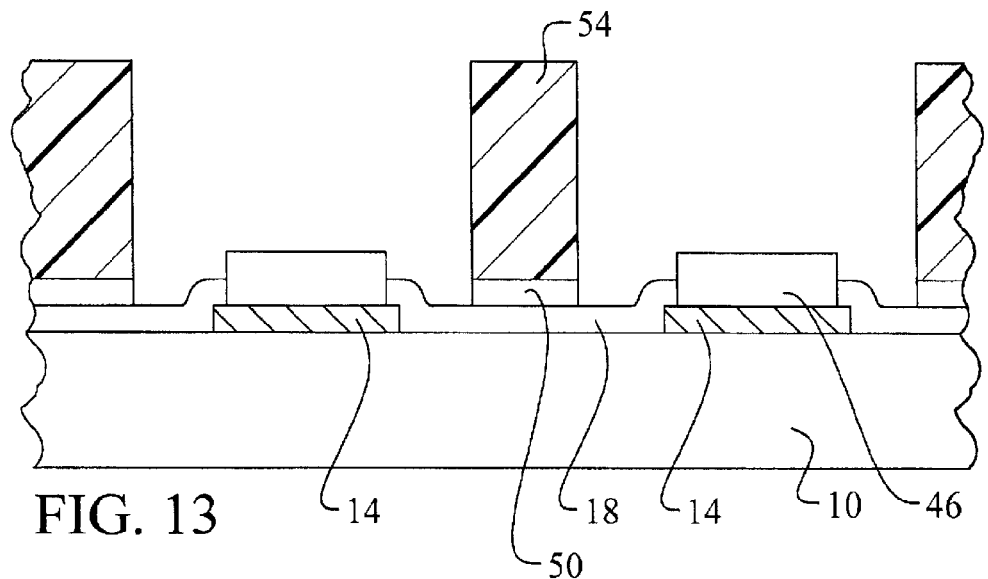

Referring now to FIG. 13, an important feature of the second preferred embodiment is illustrated. The exposed part of the sacrificial layer 50 is etched away. By removing the exposed part of the sacrificial layer 50, the underlying nickel and gold UBM caps 46 are exposed so that the solder paste can wet to the caps during the reflow operation. The exposed sacrificial layer 50 is preferably etched using an anisotropic etch so that the sacrificial layer 50 under the mask aperture 54 is not undercut. For example, the sacrificial layer 50 may be etched using a wet etch comprising HF, $HNO_3$, and $H_2O$. It is important to note that the sacrificial layer 50 remains underlying the aperture mask 54 so that the advantage of complete removal of all of the polymer material is achieved after the reflow operation.

Figure 14:
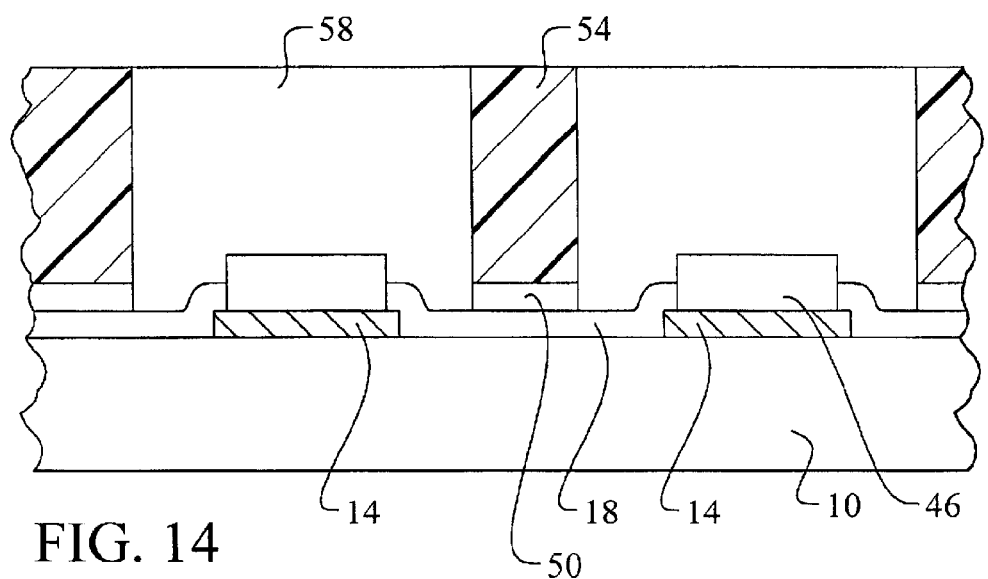

Referring now to FIG. 14, a solder layer 58 is deposited into the openings in the aperture mask 54. The solder layer 58 may comprise lead-based solder or lead-free solder. The solder layer 58 is applied to completely fill the aperture mask 54 openings as shown. The solder layer 58 may be deposited by printing, evaporating, or plating.

Figure 15:
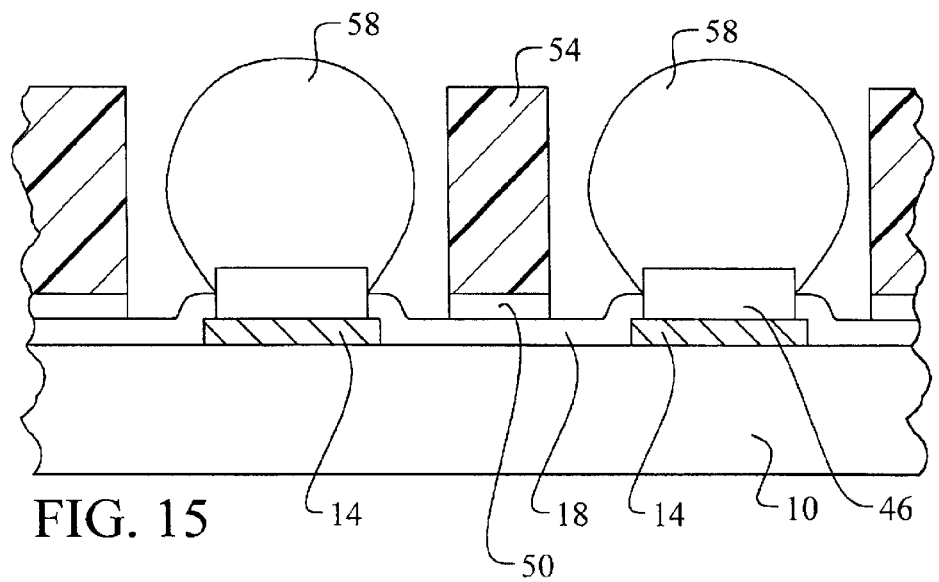

Referring now to FIG. 15, an important step in the method of the present invention is illustrated. The solder layer 58 is reflowed to form solder bumps 58. The reflowing step is performed by heating the wafers in a reflow oven to a temperature of between about 100 degrees C. and 360 degrees C. During the reflow operation, the solder layer 58 melts and wets, or bonds to, the electroless nickel and gold UBM caps 46. Because the sacrificial layer 50 and the aperture mask 54 do not wet with the solder paste layer 58, the solder pulls away from these materials. The surface tension of the molten solder layer 58 causes it to form a solder ball or bump overlying the nickel and gold UBM caps 46 and the contact pads 14.

Figure 16:
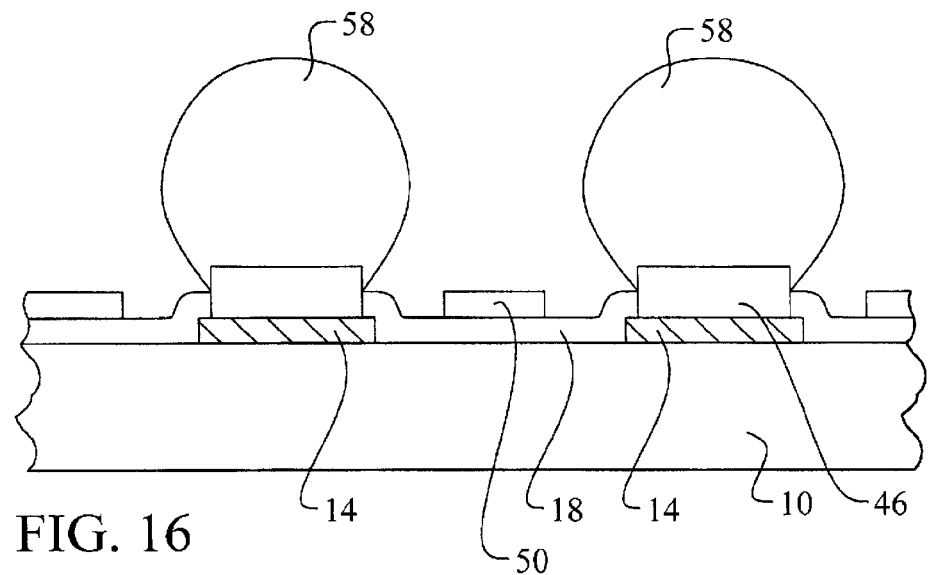

Referring now to FIG. 16, the aperture mask 54 is removed after the reflow operation. The aperture mask 54 is preferably removed using a chemical solvent strip. The strip of the aperture mask 54 reveals the remaining sacrificial layer 50.

Figure 17:
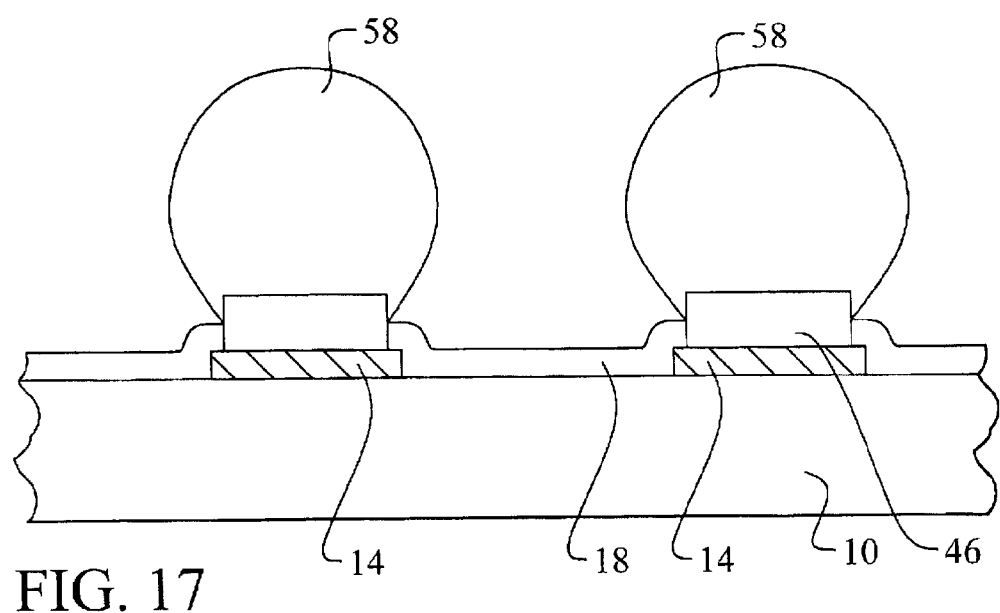

Referring now to FIG. 17, an important feature of the second preferred embodiment is illustrated. The remaining sacrificial layer 50 is etched away. The sacrificial layer 50 is etched away using an etching chemistry that selectively etches the sacrificial layer 50 without etching the solder bumps 58. For example, the sacrificial layer 50 may be etched using, for example, a wet etch comprising HF, $HNO_3$, and $H_2O$.

The removal of the exposed sacrificial layer 50 insures that all residue of the aperture mask 54 is removed. In addition, any flux residue from the solder paste layer 58 is removed with the sacrificial layer 50. The use of the sacrificial layer 50 thereby eliminates the need for a high-pressure jet deflux station for flux removal. In addition, the underlying passivation layer 18 is protected from scratches or other process contamination. Finally, if a second reflow operation is required, then the sacrificial layer 50 may be left on the wafer until after the second reflow is completed.

The advantages of the process of the present invention can now be enumerated. First, an effective method for forming solder bumps has been achieved. Second, the method utilizes a novel sacrificial layer underlying the aperture mask that enables the complete removal of the aperture mask material after reflow. Third, the method may be used with sputter applied UBM layers or with electroless plated nickel and gold. Finally, the method is suitable for use with lead-based or lead-free solder.

As shown in the preferred embodiments, the present invention provides a very manufacturable method to form solder bumps in the manufacture of an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form solder bumps on an integrated circuit device comprising:
   providing contact pads overlying a semiconductor substrate and a passivation layer overlying said contact pads wherein said passivation layer has openings that expose a top surface of said contact pads;
   depositing a sacrificial layer overlying said passivation layer and said exposed top surface of contact pads wherein said sacrificial layer is not wettable to solder;
   depositing an underbump metallurgy layer (UMB) overlying said sacrificial layer;
   thereafter patterning said underbump metallurgy layer to form UBM caps overlying said contact pads;
   forming an aperture mask overlying said sacrificial layer wherein said aperture mask has openings that expose said sacrificial layer overlying said contact pads and wherein said aperture mask comprises a laser drilled polymer;
   thereafter etching away said sacrificial layer where said sacrificial layer is exposed by said aperture mask openings to thereby expose said contact pads;
   thereafter depositing a solder layer into said openings in said aperture mask;
   thereafter reflowing said solder layer to form solder bumps overlying said contact pads;
   thereafter stripping away said aperture mask; and
   thereafter etching away remaining said sacrificial layer to complete formation of said solder bumps in the manufacture of said integrated circuit device wherein said etching away insures complete removal of all residue of said aperture mask.

2. The method according to claim 1 wherein said sacrificial layer comprises one of the group of: titanium, titanium-tungsten, and chromium.

3. The method according to claim 1 wherein said aperture mask comprises one of the group of: metal stencil, photosensitive resist, dry film, and laser drilled polymer.

4. The method according to claim 1 wherein said solder layer comprises one of the group of: lead-based solder and lead-free solder.

5. The method according to claim 1 wherein said step of depositing a solder layer comprises one of the group of: printing, evaporating, and plating.

6. The method according to claim 1 wherein said underbump metallurgy layer comprises one of the group of: nickel/gold, copper/chromium/nickel/gold, copper/nickel/gold, and copper/nickel/copper.

7. The method according to claim 1 further comprising:
   depositing a nickel and gold layer overlying said exposed top surface of contact pads to form UBM caps wherein said depositing is by electroless plating, is selective to only said contact pads, and occurs before said step of depositing said sacrificial layer; and
   etching away said exposed part of sacrificial layer after said step of forming said aperture mask and prior to said step of depositing said solder layer.

8. A method to form solder bumps on an integrated circuit device comprising:
   providing contact pads overlying a semiconductor substrate and a passivation layer overlying said contact pads wherein said passivation layer has openings that expose a top surface of said contact pads;
   depositing a sacrificial layer overlying said passivation layer and said exposed top surface of contact pads wherein said sacrificial layer is not wettable to solder;
   depositing an underbump metallurgy layer (UMB) overlying said sacrificial layer;
   patterning said underbump metallurgy layer to form UBM caps overlying said contact pads;
   forming an aperture mask overlying said sacrificial layer wherein said aperture mask has openings that expose said UBM caps and that expose a part of said sacrificial layer overlying said contact pads and wherein said aperture mask comprises a metal stencil;
   thereafter etching away said sacrificial layer where said sacrificial layer is exposed by said aperture mask openings to thereby expose said contact pads;
   thereafter depositing a solder layer into said openings in said aperture mask and overlying said UBM caps;
   thereafter reflowing said solder layer to form solder bumps overlying said UBM caps;
   thereafter stripping away said aperture mask; and
   thereafter etching away said sacrificial layer to complete formation of said solder bumps in the manufacture of said integrated circuit device wherein said etching away insures complete removal of all residue of said aperture mask.

9. The method according to claim 8 wherein said sacrificial layer comprises one of the group of: titanium, titanium-tungsten, and chromium.

10. The method according to claim 8 wherein said solder layer comprises one of the group of: lead-based solder and lead-free solder.

11. The method according to claim 8 wherein said step of depositing a solder layer comprises one of the group of: printing, evaporating, and plating.

12. The method according to claim 8 wherein said underbump metallurgy layer comprises one of the group of: nickel/gold, copper/chromium/nickel/gold, copper/nickel/gold, and copper/nickel/copper.

13. A method to form solder bumps on an integrated circuit device comprising:
   providing contact pads overlying a semiconductor substrate and a passivation layer overlying said contact pads wherein said passivation layer has openings that expose a top surface of said contact pads;
   depositing a sacrificial layer overlying said exposed top surface of contact pads wherein said sacrificial layer is not wettable to solder;
   depositing a sacrificial nickel and gold layer overlying said sacrificial layer thereafter patterning said nickel and gold layer to form nickel and gold layer caps overlying said contact pads;
   forming an aperture mask overlying said sacrificial layer wherein said aperture mask has openings that expose a part of said sacrificial layer overlying said contact pads pads and wherein said aperture mask comprises a dry film;

thereafter etching away said exposed part of said sacrificial layer;

thereafter depositing a solder layer into said openings in said aperture mask;

thereafter reflowing said solder layer to form solder bumps overlying said contact pads;

thereafter stripping away said aperture mask; and thereafter etching away said sacrificial layer to complete formation of said solder bumps in the manufacture of said integrated circuit device wherein said etching away insures complete removal of all residue of said aperture mask.

14. The method according to claim 13 wherein said sacrificial layer comprises one of the group of: titanium, titanium-tungsten, and chromium.

15. The method according to claim 13 wherein said solder layer comprises one of the group of: lead-based solder and lead-free solder.

16. The method according to claim 13 wherein said step of depositing a solder layer comprises one of the group of: printing, evaporating, and plating.

17. The method according to claim 13 wherein said nickel and gold layer is deposited to a combined thickness of between about 4,300 Angstroms and 6,300 Angstroms.

* * * * *